United States Patent
Inaba et al.

(10) Patent No.: US 8,198,957 B2
(45) Date of Patent: Jun. 12, 2012

(54) MICRO-ELECTRO-MECHANICAL-SYSTEM (MEMS) RESONATOR AND MANUFACTURING METHOD THEREOF

(75) Inventors: Shogo Inaba, Suwa-Gun (JP); Akira Sato, Suwa-Gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/270,868

(22) Filed: Oct. 11, 2011

(65) Prior Publication Data
US 2012/0025922 A1 Feb. 2, 2012

Related U.S. Application Data

(63) Continuation of application No. 12/639,102, filed on Dec. 16, 2009, now Pat. No. 8,063,721, and a continuation of application No. 11/561,146, filed on Nov. 17, 2006, now Pat. No. 7,656,252.

(30) Foreign Application Priority Data

Nov. 17, 2005 (JP) ................................. 2005-332444
Nov. 17, 2005 (JP) ................................. 2005-332445
Sep. 26, 2006 (JP) ................................. 2006-261135

(51) Int. Cl.
 *H03H 9/00* (2006.01)
 *H03H 3/007* (2006.01)

(52) U.S. Cl. ......................................... 333/187; 333/188
(58) Field of Classification Search .................. 333/186, 333/187, 188, 200, 262
See application file for complete search history.

(56) References Cited

U.S. PATENT DOCUMENTS

| 6,249,073 | B1 | 6/2001 | Nguyen et al. |
| 7,245,057 | B2 | 7/2007 | Ma et al. |
| 7,372,346 | B2 * | 5/2008 | Tilmans et al. ............... 333/187 |
| 2009/0302707 | A1 | 12/2009 | Inaba et al. |

FOREIGN PATENT DOCUMENTS

| JP | A-05-006891 | 1/1993 |
| JP | A-06-224385 | 9/1994 |
| JP | A-06-317404 | 11/1994 |
| JP | A-07-066280 | 3/1995 |
| JP | A-2004-266991 | 9/2004 |
| JP | A-2004-314251 | 11/2004 |
| WO | WO 2005/078752 A1 | 8/2005 |

* cited by examiner

*Primary Examiner* — Dean O Takoka
(74) *Attorney, Agent, or Firm* — Oliff & Berridge, PLC

(57) ABSTRACT

A micro-electro-mechanical-system resonator, includes: a substrate; a fixed electrode formed on the substrate; and a movable electrode, arranged facing the fixed electrode and driven by an electrostatic attracting force or an electrostatic repulsion force that acts on a gap between the fixed electrode and the movable electrode. An internal surface of a support beam of the movable electrode facing the fixed electrode has an inclined surface.

13 Claims, 8 Drawing Sheets

MICRO-ELECTRO-MECHANICAL-SYSTEM (MEMS) RESONATOR AND MANUFACTURING METHOD THEREOF

This is a Continuation of application Ser. No. 12/639,102 filed Dec. 16, 2009, which in turn is a a Continuation of application Ser. No. 11/561,146 filed Nov. 17, 2006, now U.S. Pat. No. 7,656,252, which claims priority to Japanese Patent Application Nos. 2006-261135 (filed Sep. 26, 2006), 2005-332445 (filed Nov. 17, 2005) and 2005-332444 (filed Nov. 17, 2005). The disclosure of the prior application is hereby incorporated by reference in their entirety.

BACKGROUND

1. Technical Field

The present invention relates to a MEMS resonator and a manufacturing method thereof.

2. Related Art

In recent years, MEMSs have exhibited a favorable growth in the usage thereof for apparatuses such as acceleration sensors and video devices. MEMS is an acronym of Micro-Electro-Mechanical System, and there are various interpretations for what encompassed within the conceptual range thereof. Generally, it means, "fine functional devices produced using semiconductor manufacturing techniques", while in some cases, it is also referred to as "micro machine", or "micro system technology (MST)". Those devices are manufactured based on fine processing techniques developed for fabrication of semiconductors. Currently, MEMSs are manufactured individually, or, produced onto the integrated circuit (IC) in a process after the manufacturing thereof.

Along with the trend of semiconductor devices becoming smaller and are formed in higher integration, through holes or contacts holes (hereinafter simply referred to as "holes") are made finer; hence a high reliability is required in metallization. Therefore, those holes require a higher coverage ratio of wiring metal. A semiconductor device manufacturing method has been suggested which improves the coverage ratio of the wiring metal, in the case where the aspect ratio of holes such as through holes or contact holes is large. The method includes: a process for forming in advance a stopper film in a vicinity of the bottom of a hole to be formed, in a location surrounding the hole; and a process for forming a sidewall on the internal wall of the stopper film. JP-A-5-6891 is an example of related art.

Moreover, in a method for manufacturing a semiconductor device such as an insulation gate type device having a thick field oxide film, if the processed shape of the field oxide film is deficient, wire thinning occurs in the gate electrode or in the main wire through which a main current flows at a tapered edge of the field oxide film, the wire being composed of Al and the like. In an extreme case, a step disconnection of wire occurs, significantly impairing the reliability of electrode wirings. In order to reduce the occurrences of such problem, a semiconductor manufacturing method is suggested, in which a taper at an arbitrary angle meeting the thick field oxide film is easily formed and a control over the taper angle processing is improved. JP-A-7-66280 is an example of related art.

Sidewall-shaped etching residue in a MEMS structure of a MEMS resonator has been either removed by slightly strong over etching, or, left as it is. In the coming years, it will be necessary to flatten the MEMS structure in a MEMS process performed simultaneously with an IC manufacturing. Therefore, if the occurrence of the sidewall-shaped etching residue in the MEMS structure can be prevented, the reliability of the MEMS resonator can be increased.

SUMMARY

An advantage of the present invention is to provide a highly reliable MEMS resonator and a method for manufacturing the same, by preventing the occurrence of the sidewall-shaped etching residue in the MEMS structure.

According to a first aspect of the invention, a MEMS resonator includes: a substrate; a fixed electrode formed on the substrate; and a movable electrode, arranged facing the fixed electrode and driven by an electrostatic attracting force or an electrostatic repulsion force that acts on a gap between the fixed electrode and the movable electrode; wherein an internal surface of a support beam of the movable electrode facing the fixed electrode has an inclined surface.

According to the above first aspect of the invention, since the internal surface of the support beam of the movable electrode is inclined, it is possible to make the cross-sectional shape of the support beam of the movable electrode to be smooth, thereby preventing the occurrence of a sidewall-shaped etching residue. Hence, the status of disturbance to movability of the MEMS structure or a current leak is improved, thereby providing a highly reliable MEMS resonator.

In this MEMS resonator, the inclined surface may have an inclination angle.

According to a second aspect of the invention, a MEMS resonator includes: a substrate; a fixed electrode formed on the substrate; and a movable electrode, arranged facing the fixed electrode and driven by an electrostatic attracting force or an electrostatic repulsion force that acts on a gap between the fixed electrode and the movable electrode; wherein the fixed electrode has a tapered surface on a side thereof.

According to the above second aspect of the invention, the tapered surface of the side of the fixed electrode makes the side-cross-sectional shape of the fixed electrode smooth, thereby preventing the occurrence of a sidewall-shaped etching residue. Hence, the status of disturbance to movability of the MEMS structure or of a current leak is improved, thereby providing a highly reliable MEMS resonator.

In this MEMS resonator, the tapered surface may have an inclination angle.

In this MEMS resonator, the gap may have a constant distance.

According to a third aspect of the invention, a method for manufacturing a MEMS resonator includes: forming, on a substrate, a fixed electrode having a sidewall on a side thereof; and forming a movable electrode above the fixed electrode, having a gap in between, and arranged to face the fixed electrode.

According to the above third aspect of the invention, by forming the sidewall on the side of the fixed electrode, the internal surface of the support beam of the movable electrode is inclined; hence it is possible to make the cross-sectional shape of the support beam of the movable electrode to be smooth, thereby preventing the occurrence of a sidewall-shaped etching residue. Consequently, the status of disturbance to movability of the MEMS structure or of a current leak is improved, thereby providing the method for manufacturing a highly reliable MEMS resonator.

According to a forth aspect of the invention, a method for manufacturing a MEMS resonator includes: forming, on a substrate, a fixed electrode having a tapered surface on a side thereof; and forming a movable electrode above the fixed electrode, having a gap in between, and arranged to face the fixed electrode.

According to the above forth aspect of the invention, the tapered surface of the side of the fixed electrode makes the side-cross-sectional shape of the fixed electrode smooth, thereby preventing the occurrence of a sidewall-shaped etching residue. Consequently, the status of disturbance in movability of the MEMS structure or the status of a current leak is improved, thereby providing the method for manufacturing a highly reliable MEMS resonator.

In this method for manufacturing the MEMS resonator, forming the movable electrode may further include: forming a sacrifice film on the fixed electrode; and thereafter forming the movable electrode on the substrate and on the sacrifice film, so that the movable electrode is arranged to face at least part of the fixed electrode.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments in which the invention is applied will now be described with references to the accompanying drawings.

First Embodiment

Figure 1:
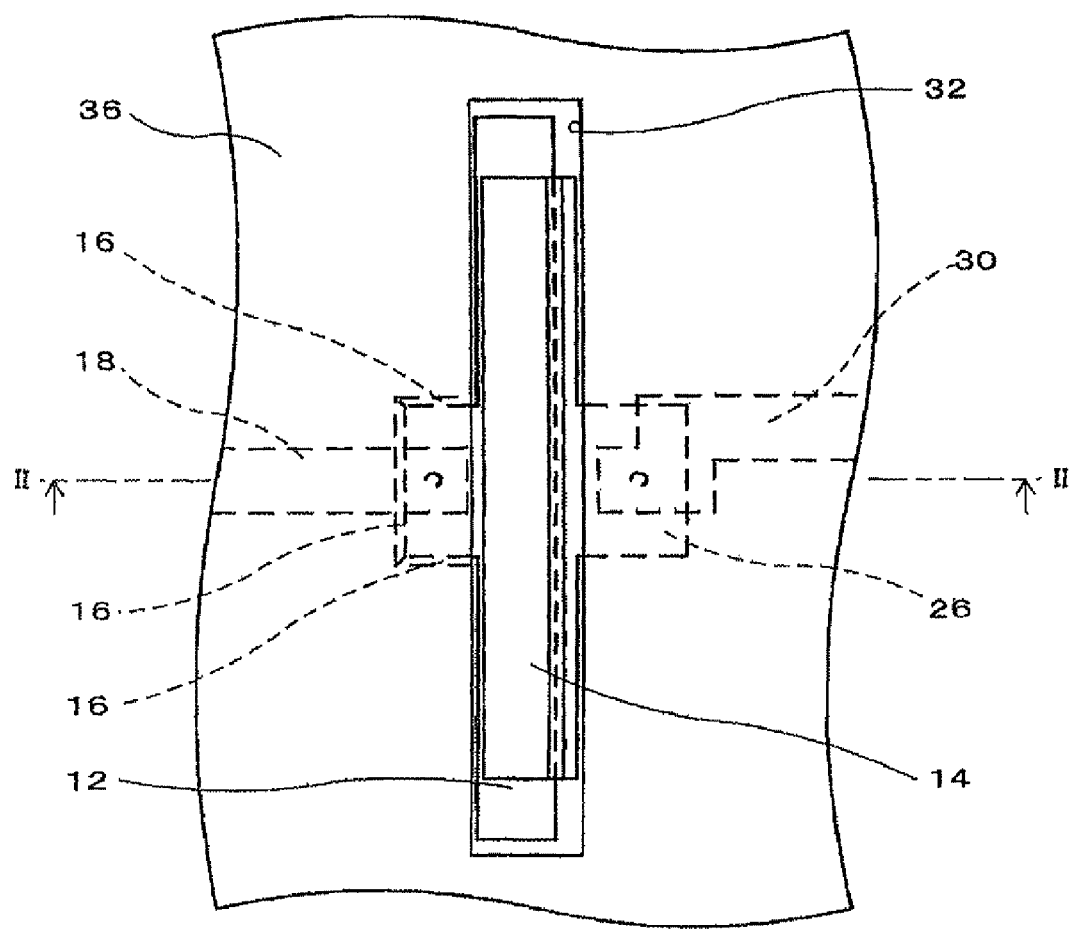
FIG. 1 is a schematic top view drawing showing a MEMS resonator according to a first embodiment of the invention.
Figure 2:
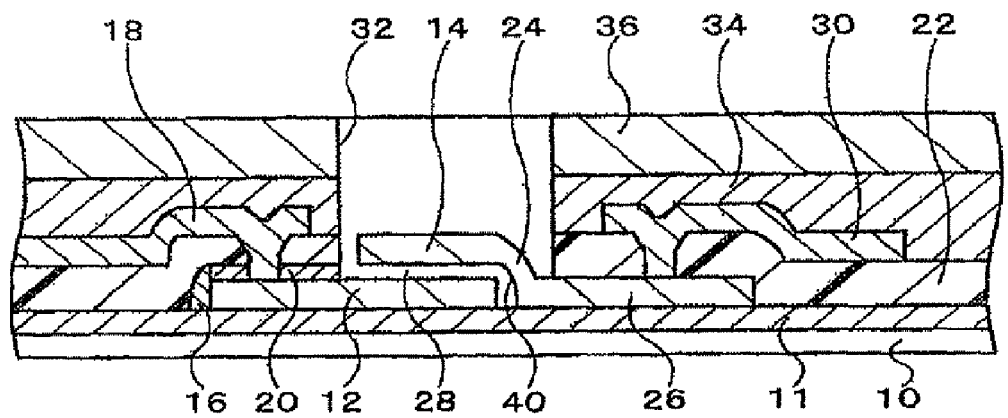
FIG. 2 is a sectional drawing showing the MEMS resonator according to the first embodiment of the invention.

FIG. 1 is a schematic top view drawing showing a MEMS resonator according to a first embodiment of the invention. FIG. 2 is a sectional drawing showing the MEMS resonator according to the first embodiment of the invention. The MEMS resonator according to this embodiment includes, as shown in FIG. 2, a substrate 10 and a MEMS structure arranged on the surface thereof.

A single-crystal semiconductor substrate that is composed of, for instance, silicon (Si) or gallium arsenide (GaAs) may be used for the substrate 10. Particularly, it is desirable that the substrate be the single-crystal silicone substrate. A fixed electrode 12 and a movable electrode 14 composed of polycrystalline silicone are formed on the surface of the substrate 10.

The fixed electrode 12 has a thin-planar shape as a whole, and is arranged on the substrate 10 via an insulation film 11. On sides of the fixed electrode 12, sidewalls 16 are formed. Here, a sidewall indicates a state where its thickness increases as it approaches the base of the fixed electrode 12 (the substrate 10). The outer surfaces of the sidewalls 16 may be plane or curve. The sidewalls 16 may have an inclination angle. The inclination angle of the sidewalls 16 is, for instance, at 5 to 15 degrees inclusive. The fixed electrode 12 is wired, penetrating through a sacrifice film 20 and an insulation film 22, to a wiring layer 18 that extends on the insulation film 22. The fixed electrode 12 is metallized by the wiring layer 18, while it may also be metallized, using conductors arranged in a different layer than the wiring layer 18, the conductors formed with metals such as Cu, Al, Ta, Cr, and W.

The movable electrode 14 has a thin-planar shape as a whole, and is arranged directly above the fixed electrode 12. The movable electrode 14 has a support beam 24, in a structure of so-called cantilever beam. The support beam 24 has a shape of either a band or a bar, and a fixed portion 26 arranged at the end of the support beam 24 is arranged on the substrate 10 via the insulation film 11. The movable electrode 14 may also be a doubly clamped cantilever beam or a support beam with three or more clamps. The movable electrode 14 is arranged via a gap 28, facing the fixed electrode 12. The gap 28 may have a constant distance. The movable electrode 14 has an inclined surface 40 at the internal surface of the support beam 24 of the movable electrode 14 that faces the fixed electrode 12. The inclined surface 40 may be plane or curve. The inclined surface 40 may also be a surface that continues to the entire internal surface of the support beam 24 of the movable electrode 14. The inclined surface 40 may have an inclination angle. The inclination angle of the inclined surface 40 is, for instance, 5 to 15 degrees inclusive. By providing the inclined surface 40, the support beam 24 may be made longer. The fixed portion 26 of the fixed electrode 14 is wired, penetrating through the insulation film 22, to a wiring layer 30 that extends on the insulation film 22. The fixed portion 26 of the fixed electrode 14 is metallized with the wiring layer 30, while it may also be metallized, using conductors arranged in a different layer than the wiring layer 30, the conductors formed with metals such as Cu, Al, Ta, Cr, and W.

An opening 32 is a region that approximately corresponds to a movable portion of the movable electrode 14 and to a part of the fixed electrode 12, and is opened so as to ensure the prescribed gap 28 between the movable electrode 14 and the fixed electrode 12.

Here, the movable electrode 14 has a planar shape, and the support beam 24 has a shape of a beam (narrow width band or bar), so that when the movable electrode 14 travels in the direction back and forth toward the fixed electrode 12 as described later, mainly the support beam 24 bends and deforms, and the movable electrode 14 is less likely to deform compared to the support beam 24. The movable electrode 14 is supported by the support beam 24, in a state having the gap 28 between the support beam 24 and the fixed electrode 12 which is a lower layer on the substrate 10. As a result, the movable electrode 14 is in the state where it can travel toward the substrate 10 by the elastic deformation of the support beam 24.

A wiring layer insulation film 34 is formed on the wiring layer 18 and on the wiring layer 30, and a protection film 36 is formed on the wiring layer insulation film 34.

The MEMS resonator according to the first embodiment is driven by either an electrostatic attracting force or an electrostatic repulsion force that acts on the gap 28 between the movable electrode 14 and the fixed electrode 12. By impressing a periodically changing voltage between the wiring layer 18 and the wiring layer 30, the electrostatic attracting force or the electrostatic repulsion force periodically occurs between the fixed electrode 12 and the movable electrode 14, thereby vibrating the movable electrode 14. In this case, as it is known, the change of the periodical voltage between the movable electrode 14 and the fixed electrode 12 that has direct-current grounding may be generated, by impressing an alternating voltage to the movable electrode 14. Alternatively, the alternating voltage may be supplied in a state in which the DC bias is impressed between the fixed electrode 12 and the movable electrode 14. For instance, a prescribed DC bias voltage is set between the fixed electrode 12 and the movable electrode 14, so that an input signal (alternating voltage) is supplied to the movable electrode 14.

In the MEMS resonator according to the first embodiment, when a semiconductor substrate is used as the substrate 10, various kinds of circuits such as a drive circuit for driving the above-referenced movable electrode, an output circuit for obtaining output signals, and an input circuit for introducing input signals are formed in the semiconductor substrate. That is to say, by forming them on, the semiconductor substrate, the resonator structure and the circuit structure can be integrated. With such organization of the semiconductor device, it is possible to make the semiconductor device considerably more compact, compared to the case of using a separate resonator device that corresponds to the above-referenced resonator structure, or the case where a resonator structure and a circuit structure are constructed as separate bodies. Moreover, wiring redundancy between the circuits can also be excluded, so that the improvement of characteristics is also expected.

In the MEMS resonator according to the first embodiment, since the internal surface of the support beam 24 of the movable electrode 14 is the inclined surface 40, it is possible to make the cross-sectional shape of the support beam 24 of the movable electrode 14 to be smooth, thereby preventing the occurrence of a sidewall-shaped etching residue, consequently eliminating the negative effect in the vibration movements of the movable electrode 14. Further, a path of electric leak pass between the fixed electrode 12 and the movable electrode 14 is, eliminated. That is to say, the status of disturbance in movability of the MEMS resonator or the status of a current leak is improved.

A method for manufacturing a MEMS resonator according to the first embodiment of the invention will now be described with references to the accompanying drawings.

Figure 3A:
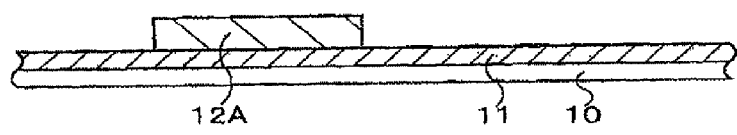
FIGS. 3A to 3E are drawings for illustrating a manufacturing method of the MEMS resonator according to the first embodiment of the invention.

FIGS. 3A to 3E and FIGS. 4A to 4D are drawings for illustrating the manufacturing method of the MEMS resonator according to the first embodiment of the invention. As shown in FIG. 3A, the substrate 10 is first prepared in the manufacturing method of the MEMS resonator according to this embodiment. The substrate 10 is composed with, for instance, SiN. The thickness of the substrate 10 is, for instance, approximately 100 to 2000 nm by 0.1 nm. Unillustrated insulation film composed of a material such as silicon oxide ($SiO_2$) may be formed on the surface of the substrate 10 by sputtering or by thereto oxidation. This insulation film may also be composed of a native oxide film formed naturally on the surface of the substrate. Moreover, the insulation film 11 composed of a material such as silicon nitride ($Si_3N_4$) may be formed on the insulation film by sputtering or by chemical vapor deposition (CVD). This insulation film 11 is deposited mainly from a manufacturing perspective, and may also function as, for instance, an etch stop film when carrying out the later-described etching of the sacrifice film.

Thereafter, a fixed electrode 12A is formed on the substrate 10 via the insulation film 11. A method for forming the fixed electrode 12A includes, for instance, etching of a MEMS substructure formed on the substrate 10. A material used for the MEMS substructure is, for instance, polycrystalline silicon (poly-Si). The thickness of the MEMS substructure is, for instance, approximately 1000 to 4000 nm by 0.1 nm.

Figure 3B:
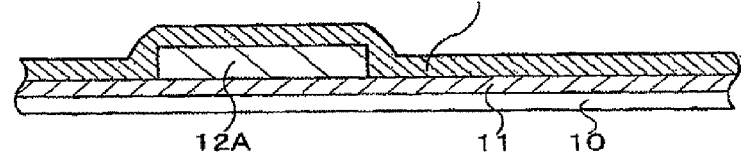

Subsequently, as shown in FIG. 3B, an insulation film 38 is formed on the insulation film 11 and on the fixed electrode 12A. The thickness of the insulation film 38 is, for instance, approximately 100 to 4000 nm by 0.1 nm. The insulation film 38 is for forming a gap between the later-described movable electrode 14 and the fixed electrode 12. The insulation film 38 is patterned so that it exists, at least, in side regions of the fixed electrode 12A described later. At this time, it is desirable that the insulation film 38 is patterned in a way that it is limited to exist only in the side regions of the fixed electrode 12A.

Figure 3C:
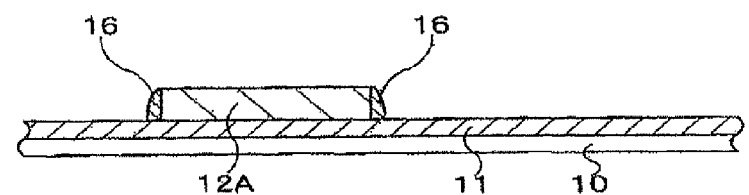

As shown in FIG. 3C, the sidewalls 16 are then formed by etching the insulation film 38. The sidewalls 16 may also be a surface that continues all around the fixed electrode 12A. In the cross-sectional shape including the fixed electrode 12A and the sidewalls 16, the bottom part has a wider width than the top part.

Figure 3D:
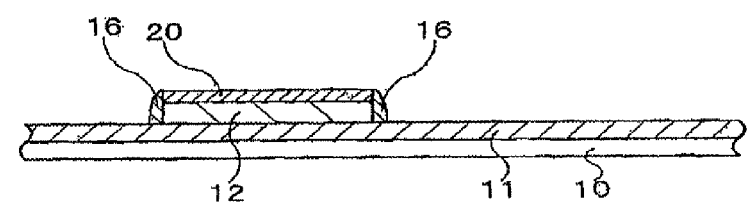

As shown in FIG. 3D, the sacrifice film 20 is then formed on the fixed electrode 12A. By forming the sacrifice film 20, the fixed electrode 12 is formed under the sacrifice film 20. A method for forming the sacrifice film 20 includes, for instance, thermo oxidation. The thickness of the sacrifice film 20 is, for instance, approximately 100 to 2000 nm by 0.1 nm. The sacrifice film 20 is for forming a gap, which will be described later, between the movable electrode 14 and the fixed electrode 12. The sacrifice film 20 is patterned so that it exists, at least, in a region including a forming region of the movable electrode 14. At this time, it is desirable that the sacrifice film 20 is patterned in a way that it is limited to exist only in the forming region of the movable electrode 14.

Figure 3E:
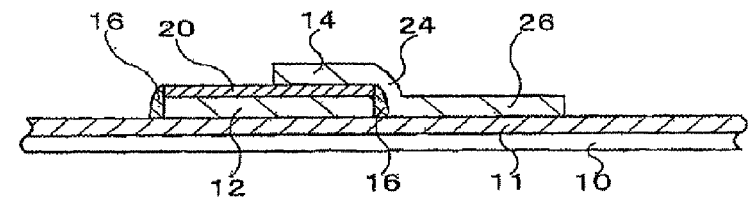

As shown in FIG. 3E, the movable electrode 14 is formed on the insulation film 11, the sacrifice film 20, and on the sidewalls 16, so that it is arranged facing at least part of the fixed electrode 12. The movable electrode 14 is formed above the fixed electrode 12 via the sacrifice film 20 and via the sidewalls 16, the movable electrode being positioned to face the fixed electrode 12. The movable electrode 14 has a support beam 24, in a structure of so-called cantilever beam. The support beam 24 has a shape of either a band or a bar, and the fixed portion 26 arranged at the end of the support beam 24 is arranged on the substrate 10 via the insulation film 11. A method for forming the movable electrode 14 includes, for instance, etching of a MEMS superstructure formed on the substrate 11 and on the sacrifice film 20. A material used for the MEMS superstructure is, for instance, poly-Si. The thickness of the MEMS superstructure is, for instance, approximately 1000 to 4000 nm by 0.1 nm.

Figure 4A:
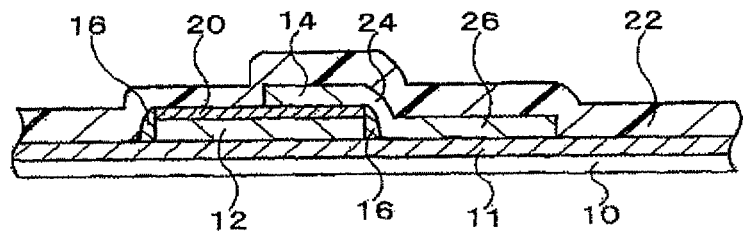
FIGS. 4A to 4D are drawings for illustrating the manufacturing method of the MEMS resonator according to the first embodiment of the invention.

Subsequently, as shown in FIG. 4A, the insulation film 22 is formed on the insulation film 11, the sacrifice film 20, the fixed electrode 12, and on the sidewalls 16. Materials used for the insulation film 22 are, for instance, tetra-ethyl-Orthosilicate (TEOS) and borophosphosilicate glass (BPSG, or, silicate glass film). The thickness of the insulation film 22 is, for instance, approximately 1000 by 0.1 nm for TEOS, and approximately 8000 by 0.1 nm for BPSG.

Figure 4B:
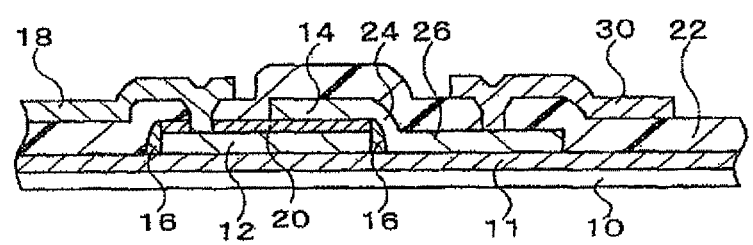

As shown in FIG. 4B, the wiring layers 18 and 30 are formed on the insulation film 22. The wiring layer 18 penetrates through the sacrifice film 20 and the insulation film 22, extends on the insulation film 22, and is connected to the fixed electrode 12. The wiring layer 30 penetrates through the insulation film 22, extends thereon, and is connected to the fixed portion 26 of the fixed electrode 14. A material used for the wiring layers 18 and 30 is AlSiCu or AlCu (alloy that includes aluminum). The thickness of the wiring layers 18 and 30 is, for instance, approximately 5000 to 20000 nm by 0.1 nm. All the structural elements that constitute the MEMS resonator are formed on the substrate 10 after the completion of this process.

Figure 4C:
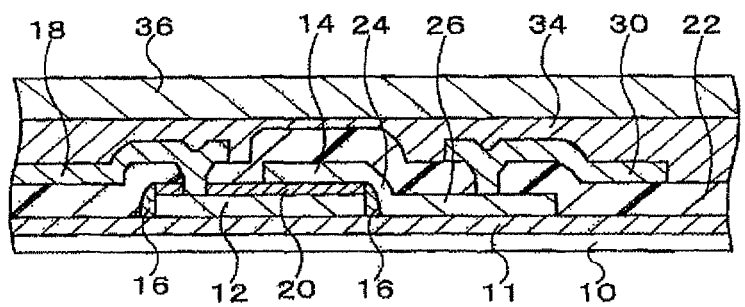

As shown in FIG. 4C, the wiring layer insulation film 34 is then formed on the insulation film 22 and on the wiring layers 18 and 30. The wiring layer insulation film 34 is formed, for instance, with CVD method. The thickness of the wiring layer insulation film 34 is, for instance, approximately 5000 to 10000 nm by 0.1 nm.

Further, the protection film 36 is formed on the wiring layer insulation film 34. The protection film 36 is formed, for instance, with CVD method, so as to form an oxide film and a nitride film. The thickness of the protection film 36 is, for instance, approximately 4000 by 0.1 nm for the oxide film, and approximately 4000 to 10000 by 0.1 nm for the nitride film.

Figure 4D:
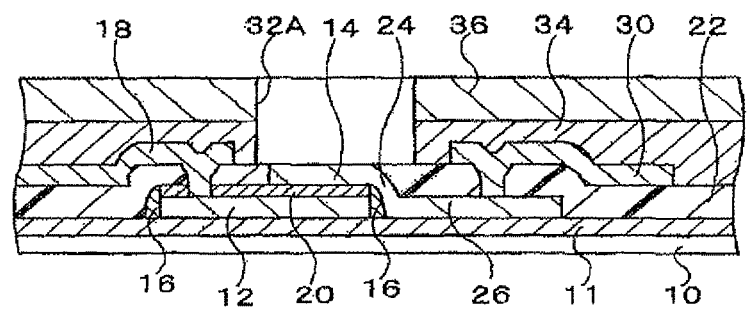

Thereafter, as shown in FIG. 4D, a MEMS release window is opened. The MEMS unit release window opens from the top of the protection film 36 down to the top of the movable electrode 14, forming an opening 32A, approximately corresponding to a movable portion of the movable electrode 14.

Subsequently, as shown in FIG. 2, the MEMS unit is released. By releasing the MEMS unit, a part of the sacrifice film 20 and of the sidewalls 16 corresponding to the opening 32A is removed, thereby forming the opening 32 so that the prescribed gap 28 is secured between the movable electrode 14 and the fixed electrode 12. In releasing the MEMS unit, part of the sacrifice film 20 and of the sidewalls 16 that corresponds to the opening 32A is removed by carrying out a wet etching using an etching fluid of hydrofluoric acids. By eliminating the generation of the foreign particles during the release etching, a time-wise processing margin of the release etching increases.

With the manufacturing method of the MEMS resonator according to the first embodiment, the internal surface of the support beam 24 of the movable electrode 14 is made to be the inclined surface 40 by forming the sidewalls 16 on the sides of the fixed electrode 12; hence, it is possible to make the cross-sectional shape of the support beam 24 of the movable electrode 14 smooth. Consequently, an occurrence of the sidewall-shaped etching residue of the movable electrode 14 is prevented, eliminating the generation of foreign particles during the release etching. By eliminating the generation of the foreign particles during the release etching, a margin of a time-wise processing in the release etching increases, as does the margin of a process-wise manufacturing condition (i.e., etching of the movable electrode 14).

Second Embodiment

Figure 5:
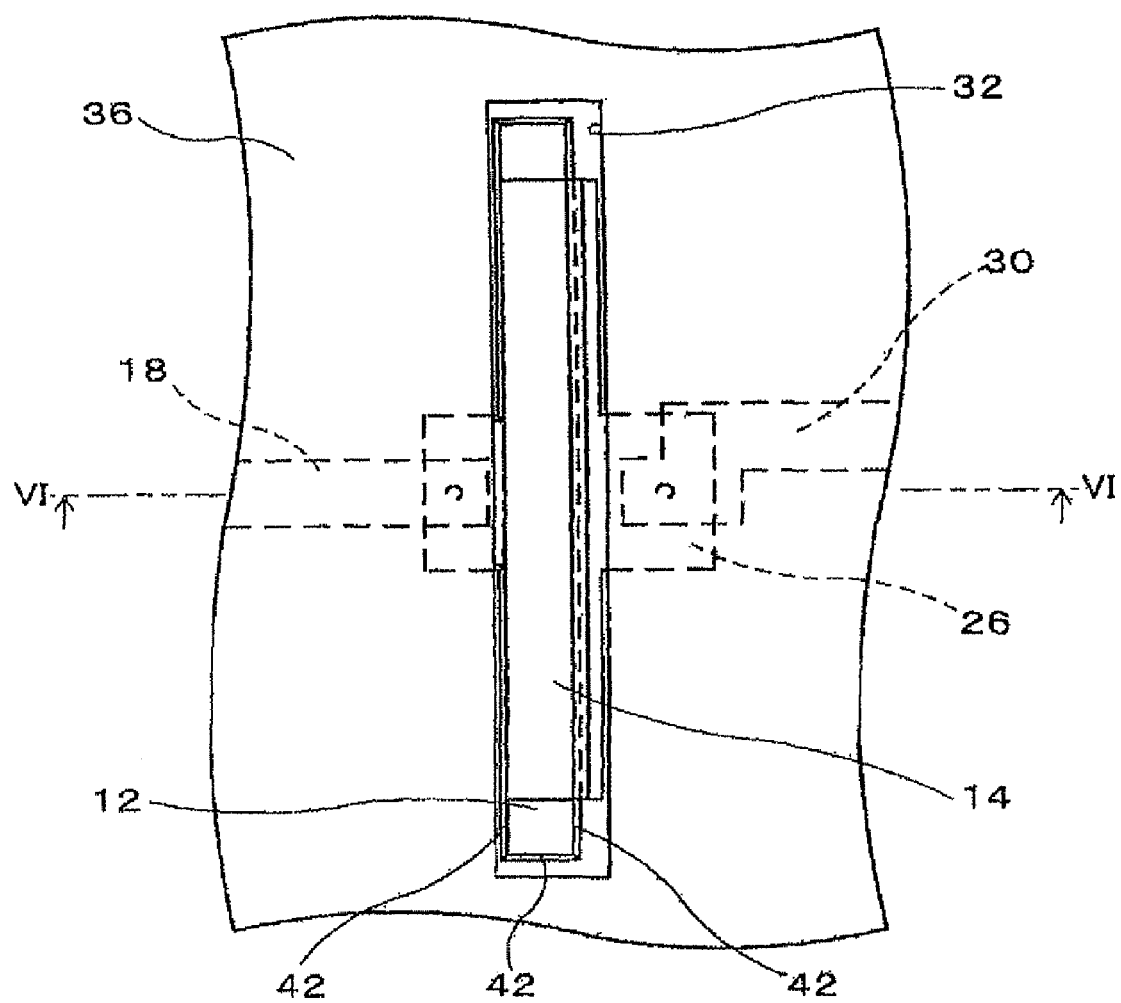
FIG. 5 is a schematic top view drawing showing a MEMS resonator according to a second embodiment of the invention.
Figure 6:
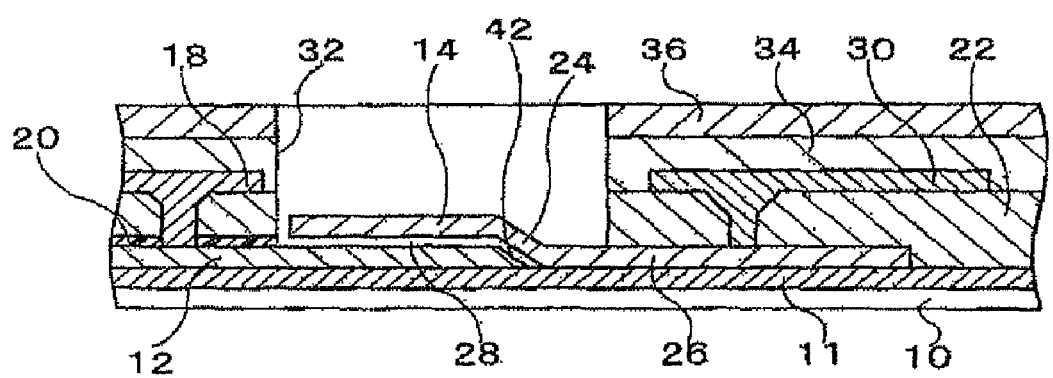
FIG. 6 is a sectional drawing showing the MEMS resonator according to the second embodiment of the invention.

FIG. 5 is a schematic top view drawing showing a MEMS resonator according to a second embodiment of the invention. FIG. 6 is a sectional drawing showing the MEMS resonator according to the second embodiment of the invention. The MEMS resonator according to the second embodiment of the invention includes, as shown in FIG. 6, the substrate 10 and the MEMS structure arranged on the surface thereof.

The fixed electrode 12 includes tapered surfaces 42 at its sides. Here, "taper" indicates a state where the thickness of the fixed electrode 12 decreases toward its edge. The tapered surfaces 42 may be plane or curve. The tapered surfaces 42 may also be a surface that continues all around the fixed electrode 12. The tapered surfaces 42 may have an inclination angle. The inclination angle of the tapered surfaces 42 is, for instance, 5 to 15 degrees inclusive. The cross-sectional shape of the tapered fixed electrode 12 is wider at the bottom than at the top.

In the MEMS resonator according to the second embodiment, the occurrence of sidewall-shaped etching residues of the movable electrode 14 is prevented, since the cross-sectional shape of the sides of the fixed electrode 12 is made smooth with the tapered surfaces 42 at the sides of the fixed electrode 12, thereby eliminating the negative effect in the vibration movements of the movable electrode 14. The area in which the fixed electrode 12 faces the movable electrode 14 increases, since the tapered surfaces 42 at the sides of the fixed electrode 12 also face the movable electrode 14. Consequently, the electrostatic attracting force and the electrostatic repulsion force acting between the fixed electrode 12 and the movable electrode 14 increase.

A method for manufacturing the MEMS resonator according to the second embodiment of the invention will now be described with references to the accompanying drawings.

Figure 7A:
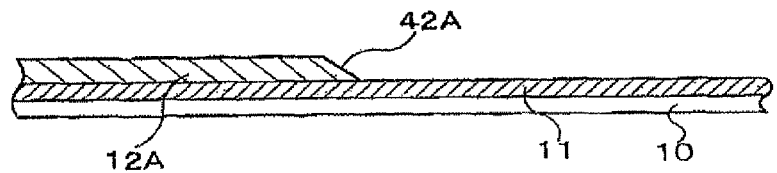
FIGS. 7A to 7D are drawings for illustrating a manufacturing method of the MEMS resonator according to the second embodiment of the invention.

FIGS. 7A to 7D and FIGS. 8A to 8D are drawings for illustrating the manufacturing method of the MEMS resonator according to the second embodiment of the invention. As shown in FIG. 7A, the substrate 10 is first prepared in the manufacturing method of the MEMS resonator according to this embodiment.

Thereafter, the fixed electrode 12A that has tapered surfaces 42A at its sides is formed on the substrate 10 via the insulation film 11. At this time, dopants are introduced to the MEMS substructure and an etching condition is configured such that the side surfaces are obliquely tapered.

Figure 7B:
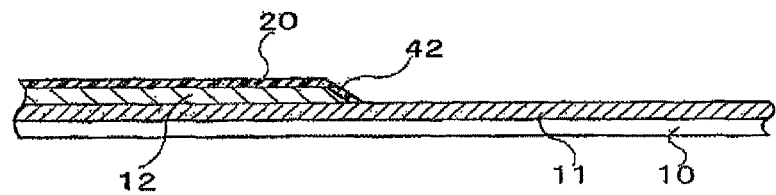

As shown in FIG. 7B, the sacrifice film 20 is then formed on the fixed electrode 12A.

Figure 7C:
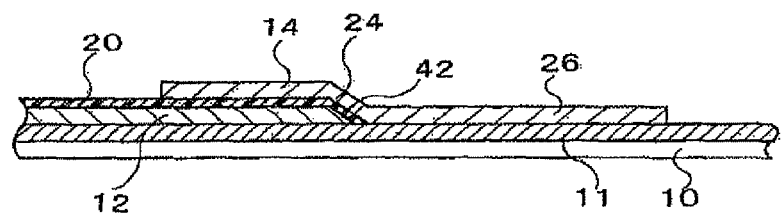

As shown in FIG. 7C, the movable electrode 14 is then formed on the insulation film 11 and on the sacrifice film 20, so that it is arranged facing at least part of the fixed electrode 12. The movable electrode 14 is formed above the fixed electrode 12 via the sacrifice film 20, the movable electrode 14 being positioned to face the fixed electrode 12.

Figure 7D:
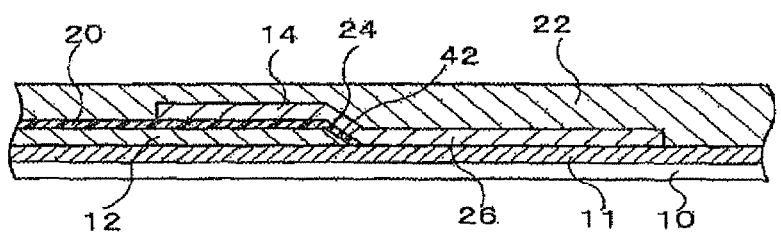

As shown in FIG. 7D, the insulation film 22 is then formed on the insulation film 11, the sacrifice film 20, and on the fixed electrode 12, in a way that the top surface of the insulation film 22 is flattened.

Figure 8A:
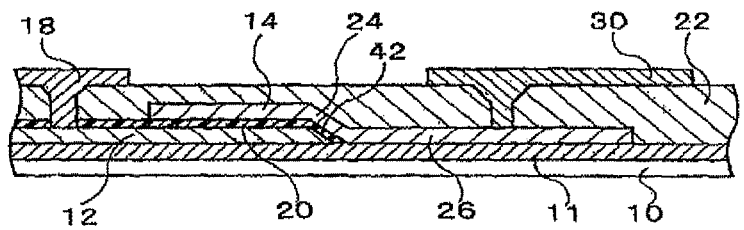
FIGS. 8A to 8D are drawings for illustrating the manufacturing method of the MEMS resonator according to the second embodiment of the invention.

Thereafter, as shown in FIG. 8A, the wiring layers 18 and 30 are formed on the insulation film 22. All the structural elements that constitute the MEMS resonator are formed on the substrate 10 after the completion of this process.

Figure 8B:
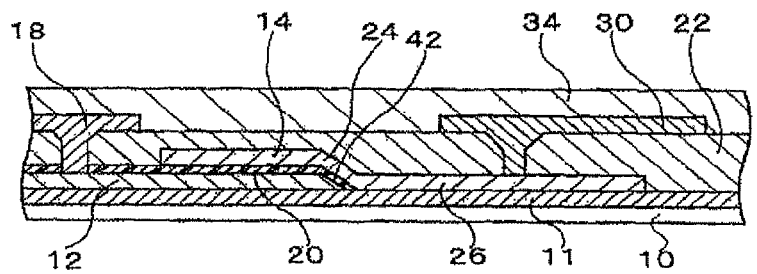

As shown in FIG. 8B, the wiring layer insulation film 34 is then formed on the insulation film 22 and on the wiring layers 18 and 30.

Figure 8C:
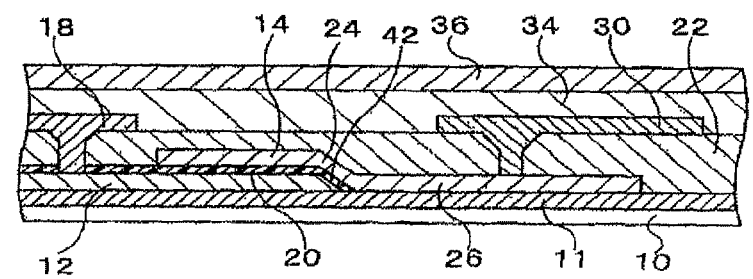

Thereafter, as shown in FIG. 8C, the protection film 36 is formed on the wiring layer insulation film 34.

Figure 8D:
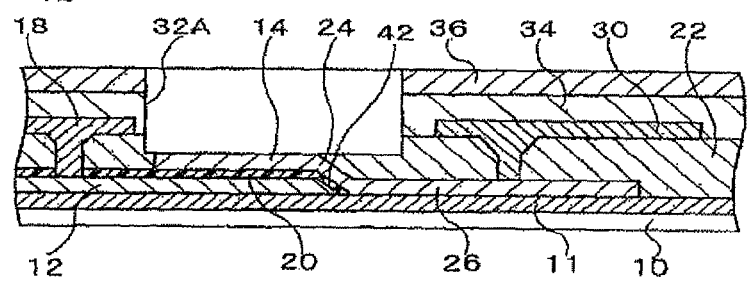

Subsequently, as shown in FIG. 8D, the MEMS release window is opened. The MEMS release window opens from the top of the protection film 36 down to the top of the movable electrode 14, forming an opening 32A, approximately corresponding to a movable portion of the movable electrode 14.

As shown in FIG. 6, the MEMS unit is then released. By releasing the MEMS unit, the sacrifice film 20 in the portion corresponding to the opening 32A is removed; thereby forming the opening 32 so that the prescribed gap 28 is secured between the movable electrode 14 and the fixed electrode 12. In releasing the MEMS unit, by carrying out a wet etching using an etching fluid of hydrofluoric acids, part of the sacrifice film 20 that corresponds to the opening 32A is removed.

In the method for manufacturing the MEMS resonator according to the second embodiment, the occurrence of sidewall-shaped etching residues of the movable electrode 14 is prevented, since the side cross-sectional shape of the fixed electrode 12 is made smooth with the tapered surfaces 42, thereby eliminating the generation of the foreign particles during the release etching. As for the rest of the composition and the manufacturing methods, what has been described in the first embodiment may be applied.

The present invention shall not be limited to the embodiments mentioned above, and may be applied to the any structure forming in a MEMS-CMOS integration process. For instance, other MEMSs include devices such as switches, resonators, acceleration sensors, and actuators.

The entire disclosure of Japanese Patent Application Nos: 2005-332444, filed Nov. 17, 2005 and 2006-261135, filed Sep. 26, 2006 and 2005-312445, filed Nov. 17, 2005 are expressly incorporated by reference herein.

What is claimed is:

1. A micro-electro-mechanical-system resonator, comprising:
   a substrate;
   a fixed electrode formed on the substrate through an insulating film; and
   a movable electrode, arranged facing the fixed electrode and driven by an electrostatic attracting force or an electrostatic repulsion force that acts on a gap between the fixed electrode and the movable electrode,
   wherein the electrostatic attracting force or the electrostatic repulsion force acting on the gap between the fixed electrode and the movable electrode causes the movable electrode to vibrate,
   the movable electrode comprising a support beam, the support beam having a fixed portion arranged on the substrate through the insulation film, and
   an internal surface of the support beam of the movable electrode facing the fixed electrode has an inclined surface.

2. The micro-electro-mechanical-system resonator according to claim 1, wherein the inclined surface has an inclination angle.

3. The micro-electro-mechanical-system resonator according to claim 1, wherein the gap has a constant distance.

4. The micro-electro-mechanical-system resonator according to claim 2, wherein the inclination angle is from 5° to 15°.

5. The micro-electro-mechanical-system resonator according to claim 1, wherein the internal surface of the support beam of the movable electrode facing the fixed electrode is curved.

6. A method for manufacturing a micro-electro-mechanical-system resonator, comprising:
   forming, on a substrate through an insulating film, a fixed electrode having a sidewall on a side thereof; and
   forming a movable electrode above the fixed electrode, having a gap in between, arranged to face the fixed electrode, and driven by an electrostatic attracting force or an electrostatic repulsion force that acts on the gap between the fixed electrode and the movable electrode,
   wherein the electrostatic attracting force or the electrostatic repulsion force acting on the gap between the fixed electrode and the movable electrode causes the movable electrode to vibrate,
   the movable electrode comprising a support beam, the support beam having a fixed portion arranged on the substrate through the insulation film, and
   an internal surface of a support beam of the movable electrode facing the fixed electrode has an inclined surface.

7. The method for manufacturing the micro-electro-mechanical-system resonator according to claim 6, wherein forming the movable electrode further comprises:
   forming a sacrifice film on the fixed electrode; and
   thereafter forming the movable electrode on the substrate and on the sacrifice film, so that the movable electrode is arranged to face at least part of the fixed electrode.

8. The method for manufacturing a micro-electro-mechanical-system resonator according to claim 6, wherein the side wall on the fixed electrode is curved.

9. The method for manufacturing a micro-electro-mechanical-system resonator according to claim 6, wherein the side wall on the side of the fixed electrode has an inclination angle from 5° to 15°.

10. A micro-electro-mechanical-system resonator, comprising:
    a substrate;
    a fixed electrode formed on the substrate through an insulating film; and
    a movable electrode, arranged facing the fixed electrode and driven by an electrostatic attracting force or an electrostatic repulsion force that acts on a gap between the fixed electrode and the movable electrode,
    the movable electrode comprising a support beam, the support beam having a fixed portion arranged on the substrate through the insulation film, and
    an internal surface of a support beam of the movable electrode facing the fixed electrode has an inclined surface, and
    the movable electrode is an extension of the support beam.

11. A micro-electro-mechanical-system resonator, comprising:
    a substrate;
    a fixed electrode formed on the substrate through an insulating film; and
    a movable electrode, arranged facing the fixed electrode and driven by an electrostatic attracting force or an electrostatic repulsion force that acts on a gap between the fixed electrode and the movable electrode,
    the movable electrode comprising a support beam, the support beam having a fixed portion arranged on the substrate through the insulation film, and comprises a horizontal portion of the support facing the fixed electrode, and
    wherein an internal surface of the support beam of the movable electrode facing the fixed electrode has an inclined surface.

12. A method for manufacturing a micro-electro-mechanical-system resonator, comprising:
    forming, on a substrate an insulating film, a fixed electrode having a sidewall on a side thereof; and
    forming a movable electrode above the fixed electrode, having a gap in between, arranged to face the fixed electrode, and driven by an electrostatic attracting force or an electrostatic repulsion force that acts on the gap between the fixed electrode and the movable electrode,
    the movable electrode comprising a support beam, the support beam having a fixed portion arranged on the substrate through the insulation film, and
    wherein an internal surface of the support beam of the movable electrode facing the fixed electrode has an inclined surface, and
    the movable electrode is an extension of the support beam.

13. A method for manufacturing a micro-electro-mechanical-system resonator, comprising:
    forming, on a substrate an insulating film, a fixed electrode having a sidewall on a side thereof; and forming a movable electrode above the fixed electrode, having a gap in between, arranged to face the fixed electrode, and driven by an electrostatic attracting force or an electrostatic repulsion force that acts on the gap between the fixed electrode and the movable electrode, the movable electrode comprising a support beam, the support beam having a fixed portion arranged on the substrate through the insulation film, and comprises a horizontal portion of the support facing the fixed electrode, and wherein an internal surface of the support beam of the movable electrode facing the fixed electrode has an inclined surface.

\* \* \* \* \*